United States Patent [19]
Beasom

[11] Patent Number: 5,744,851
[45] Date of Patent: Apr. 28, 1998

[54] BIASING OF ISLAND-SURROUNDING MATERIAL TO SUPPRESS REDUCTION OF BREAKDOWN VOLTAGE DUE TO FIELD PLATE ACTING ON BURIED LAYER/ISLAND JUNCTION BETWEEN HIGH AND LOW IMPURITY CONCENTRATION REGIONS

[75] Inventor: James D. Beasom, Melbourne Village, Fla.

[73] Assignee: Harris Corporation, Melbourne, Fla.

[21] Appl. No.: 66,697

[22] Filed: May 24, 1993

Related U.S. Application Data

[63] Continuation of Ser. No. 827,095, Jan. 27, 1992, abandoned.
[51] Int. Cl.$^6$ ................................................ H01L 23/58
[52] U.S. Cl. ...................................... 257/487; 257/493
[58] Field of Search .................................. 257/487, 493, 257/520, 505

[56] References Cited

U.S. PATENT DOCUMENTS

| | | | |
|---|---|---|---|
| 3,953,255 | 4/1976 | Combs | 148/187 |
| 4,231,056 | 10/1980 | Taylor | 257/520 |
| 4,232,328 | 11/1980 | Hartman | 257/505 |
| 4,470,062 | 9/1984 | Muramatsu | 257/520 |
| 4,567,646 | 2/1986 | Ishikawa et al. | 257/505 |
| 4,665,425 | 5/1987 | Piotsowski | 257/729 |
| 5,241,210 | 8/1993 | Nakagawa et al. | 257/487 |

*Primary Examiner*—Stephen Meier
*Attorney, Agent, or Firm*—Charles E. Wands

[57] ABSTRACT

The reduction in breakdown voltage of a device which contains adjoining regions of relatively high and low impurity concentrations within a dielectrically isolated island of an integrated circuit architecture is effectively countered by biasing the material surrounding the island, such as a support polysilicon substrate or the fill material of a isolated trench, at a prescribed bias voltage that is insufficient to cause the avalanche-generation of electron-hole pairs in the vicinity of the relatively high-to-low impurity concentration junction between the buried layer and the island. Where a plurality of islands are supported in and surrounded by a common substrate material of an overall integrated circuit architecture, the prescribed bias voltage may be set at a value that is no more positive than half the difference between the most positive and the most negative of the bias voltages that are applied to the integrated circuit. Where respective islands do not share a common (continuously connected) substrate, the surrounding material of each island is biased at a voltage sufficiently close to the island voltage as to prevent avalanche-generation of carrier pairs; this voltage may be the same bias voltage applied to the island material itself.

9 Claims, 1 Drawing Sheet

5,744,851

BIASING OF ISLAND-SURROUNDING MATERIAL TO SUPPRESS REDUCTION OF BREAKDOWN VOLTAGE DUE TO FIELD PLATE ACTING ON BURIED LAYER/ISLAND JUNCTION BETWEEN HIGH AND LOW IMPURITY CONCENTRATION REGIONS

This is a continuation of application Ser. No. 07/827,095, filed Jan. 27, 1992, now abandoned.

FIELD OF THE INVENTION

The present invention relates in general to semiconductor devices and is particularly directed to the biasing of support material surrounding a dielectrically isolated island, such as the fill material of a trench isolated integrated circuit architecture, so as to prevent the avalanche-generation of electron/hole pairs at a buried layer/island junction, which would otherwise limit the breakdown voltage of the device.

BACKGROUND OF THE INVENTION

Devices which contain a reverse-biased PN junction in the vicinity of adjoining regions of relatively high and low impurity concentrations are subject to the problem of an electric field-induced reduction in the breakdown voltage of that PN junction, where a conductor passes over a 'high/low' junction between adjoining regions of differential impurity concentration. In particular, an electric field may cause avalanche-generation of electron/hole pairs in the vicinity of the high/low junction. If the reverse-biased PN junction is within approximately a diffusion length of the location where the electron/hole pairs are generated, the charge carriers will be collected by the junction and appear as terminal currents, reducing the breakdown voltage of the PN junction.

An example of a device structure in which this problem occurs is described in an article by T. Mizoguchi et al, entitled "600V, 25A Dielectrically-Isolated Power IC with Vertical IGBT", Proceedings of the Third International Symposium on Power Semiconductor Devices and ICs, 1991, pp 40–41. In such a device, the high-low junction is formed between a wrap-around N+ buried layer, which forms the outer side boundary of an island and the N– bulk of that island. The conductor which applies a high voltage to the high/low junction is the conductor which connects to the P diffusion that forms a PN junction with the island. The conductor must cross the high/low junction in order to connect the P region to one or more circuit elements in another island or in other islands. Techniques to reduce this problem include the formation of a region of intermediate doping to reduce the field a the high/low junction and increasing the insulator thickness between the conductor and the high/low junction.

I have discovered that this problem can also occur at the sidewall of a semiconductor-on-insulator structure having a bottom-located or buried layer (as opposed to a wrap-around layer). A bottom-located layer is often preferred over a wrap-around layer, since it allows the PN junction formed within the island to be placed closer to the sides of the island, as no space is consumed by the buried layer and it need not be spaced apart from a side layer. Consequently, eliminating the side layer allows manufacture of devices in smaller islands, thus reducing area and cost.

As an example, FIG. 1 diagrammatically shows a dielectrically isolated semiconductor (e.g. N– type silicon) island 11 formed within a surrounding semiconductor (e.g. polysilicon) substrate 13. Island 11 is dielectrically isolated from the substrate 13 by a layer of dielectric material (oxide) 15, which extends from the top surface 17 of the structure along island sidewalls 21, and also along the floor or bottom 23 of the island 11. Island 11 contains a 'buried' high impurity concentration (N+) region 25, which is contiguous with floor 23 and forms an N+/N– junction or interface 27 with the more lightly doped N-type material of the island 11 proper. Such a high impurity concentration buried layer may be employed as a subcollector region of a bipolar (NPN) transistor. The 'high/low' junction/interface 27 between N-type island 11 and highly doped (N+) buried layer 25 extends to the sidewalls 21 of the island, so that it abuts or intersects dielectric layer 15. When a voltage is applied to and distributed throughout the substrate 13, it gives rise to an electric field. Depending upon the 'thinness' of dielectric layer 15 and the magnitude of the substrate bias voltage, this electric field may be strong enough to induce the avalanche-generation of electron/hole pairs at interface 27.

If the island architecture includes a reverse-biased PN junction in the vicinity of the island/buried layer interface 27 (for example, in the case of an NPN transistor, a reverse-biased collector-base junction 31 between N-island 11 and a P-base region 33), and the reversed-biased PN junction (31 in the example of FIG. 1) is within approximately a diffusion length of the location where the electron/hole pairs are generated, these charge carriers will be collected by the PN junction 31 and appear as terminal currents in the device. This substrate bias-induced terminal current limits the conduction or breakdown voltage of the collector-base junction of the device.

Without a side buried layer, one might attempt to solve the breakdown reduction problem by increasing the thickness of the surrounding oxide, one of the conventional methods mentioned above. Unfortunately, increasing the oxide thickness may require a very thick oxide (the Mizoguchi et al article, for example, describes an oxide thickness of 5.4 microns). A very thick oxide on the sides of an isolated island may cause stress which generated crystal defects in the islands which not only tend to produce devices with large current leakage, but also device which consume surface requiring extra area just does a side buried layer. The other prior art technique of forming an N graded region at the high/low junction might also be possible. However, the provision of such a region would require additional processing steps, increasing cost of manufacture. Even so, the above-reference article shows that a thick oxide may still be needed.

SUMMARY OF THE INVENTION

In accordance with the present invention, the unwanted reduction in breakdown voltage at the island sidewall with the dielectric is effectively countered by biasing the surrounding material, such as a support polysilicon substrate or the fill material of a surrounding dielectrically isolated trench, at a voltage that is not sufficiently different from the voltage of the island. By not sufficiently different is meant that the substrate bias voltage is insufficient to cause the avalanche-generation of electron-hole pairs in the vicinity of the relatively high-to-low impurity concentration junction between the buried layer and the island. Where a plurality of islands are supported in and surrounded by a common substrate material of an overall integrated circuit architecture, the prescribed bias voltage may be set at a value which differs from the island voltage by a value no more that half the total voltage applied to the integrated circuit. One mechanism for satisfying this requirement is to simply connect or (electrically) tie the substrate to the island bias voltage. This mechanism only applies to the case where the collectors of all sensitive devices are at the same voltage, since a continuous substrate allows only one substrate voltage in the integrated circuit. Thus, in the case of a vertical PNP transistor, for example, the substrate or trench may be connected to the most negative device voltage (the negative reverse bias voltage for the P-type collector island). Conversely, in the case of a vertical NPN transistor, the substrate or trench voltage may be connected to the most positive device voltage (the positive reverse bias voltage for the N-type collector island).

In other words, the substrate or trench material is coupled to receive a prescribed bias voltage which has a value such that, when the substrate or trench is biased at that prescribed bias voltage, a nearby reverse-biased PN junction between a device region and the island has a breakdown voltage which is greater than its breakdown voltage when the substrate or trench is biased at the same bias voltage applied to the device region.

DETAILED DESCRIPTION

As pointed out briefly above, the biasing mechanism of the present invention serves to effectively counter or prevent an unwanted reduction in breakdown voltage by setting the voltage at which the material surrounding the dielectric island is biased at a value that is not sufficiently different from the island bias voltage to cause the avalanche-generation of electron-hole pairs in the vicinity of the relatively high-to-low impurity concentration junction between the buried layer and the island.

By high-to-low impurity concentration junction is meant a readily measurable interface or transition of doping concentration within the body of semiconductor material of interest (the island), as opposed to a graded profile from high-to-low doping (e.g. a Gaussian distribution from the top surface of the island toward the bottom of the island, or a low-to-high retrograde profile measured from the top surface of the island). The island itself may have a uniform impurity distribution throughout or a graded (e.g. Gaussian) profile (high-to-low) from the top surface toward the bottom of the island. Within the island, particularly at the bottom in the case of a buried subcollector region of a bipolar transistor structure, for example, a more heavily doped region of like conductivity to the (collector) island is formed. Depending upon the process steps used to form the island and its device regions, the more heavily doped region may be introduced from either side of the island pocket. In the example of a buried subcollector region, one may typically encounter a measurable doping transition of from greater than $1 \times 10^{17}$ atoms $cm^{-3}$ in the buried layer to less than $1 \times 10^{16}$ atoms $cm^{-3}$ in the overlying island over a vertical distance through the island of less than ten microns. There will also generally be a region of island above the buried layer at least five microns thick, in which the island doping is less than $1 \times 10^{16}$ atoms $cm^{-3}$ and in which that doping varies by less than a factor of ten between any two points in the region.

Figure 1:
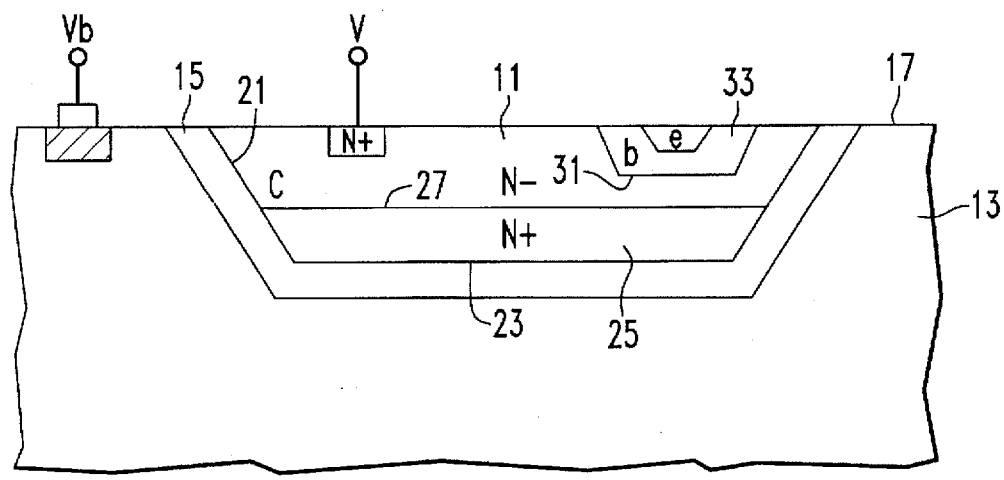
FIG. 1 diagrammatically shows a dielectrically isolated semiconductor island formed within a surrounding semiconductor substrate, and containing a buried high impurity concentration region which forms an N+/N− junction or interface with the more lightly doped N-type material of the island.

In the integrated circuit architecture of FIG. 1, substrate 13 is coupled to receive a prescribed bias Vb, the value of which may simply be the same voltage V applied to the N− island 11. As a consequence, the voltage differential across dielectric layer 15 is effectively zero, so that no electron/hole pairs will be induced at interface 27.

What is important in the choice of bias voltage for substrate 13 is that such bias voltage Vb is not too far from the voltage of the island which is sensitive to avalanche-generation at the high-low impurity concentration interface 27. This limitation on the island-to-substrate voltage differential ensures that the electric field generated as a result of the substrate bias voltage Vb is never high enough to cause avalanche generation of electron/hole pairs.

Where substrate 13 supports a plurality of dielectrically isolated islands and thereby provides an effectively continuous voltage distribution path around such islands, bias voltage Vb may be set at a value which differs from the island voltage V by a value no more that half the total voltage applied to the integrated circuit. As mentioned previously, a mechanism for satisfying this requirement is to simply tie the substrate to the island bias voltage. This mechanism only applies to the case where the collectors of all sensitive devices are at the same voltage, since a continuous substrate allows only one substrate voltage in the integrated circuit. For a vertical PNP transistor, the substrate may be connected to the most negative device voltage (the negative reverse bias voltage for the P-type collector island). In the case of a vertical NPN transistor, the substrate may be connected to the most positive device voltage (the positive reverse bias voltage for the N-type collector island).

Figure 2:
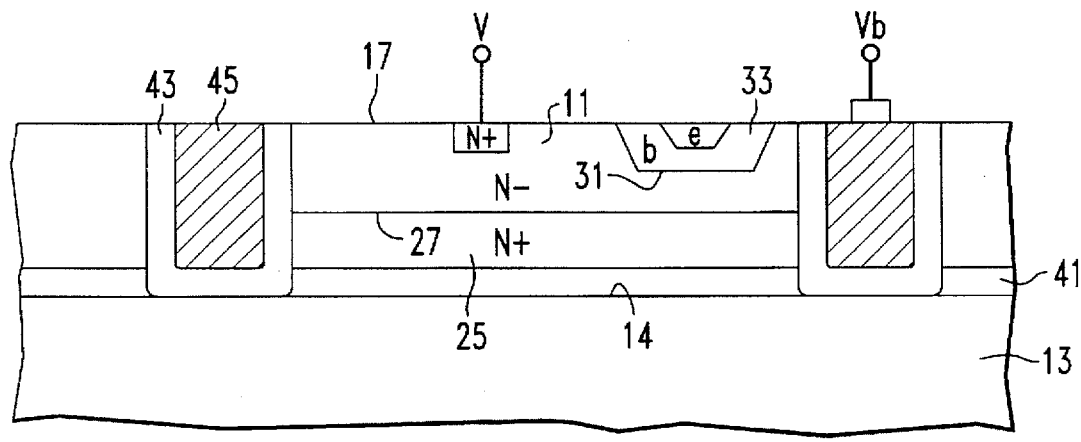
FIGS. 2 and 3 diagrammatically illustrate examples of trench-isolated island integrated circuit architectures having a buried high impurity concentration region forming an N+/N− junction or interface with more lightly doped N-type material of the island.
Figure 3:
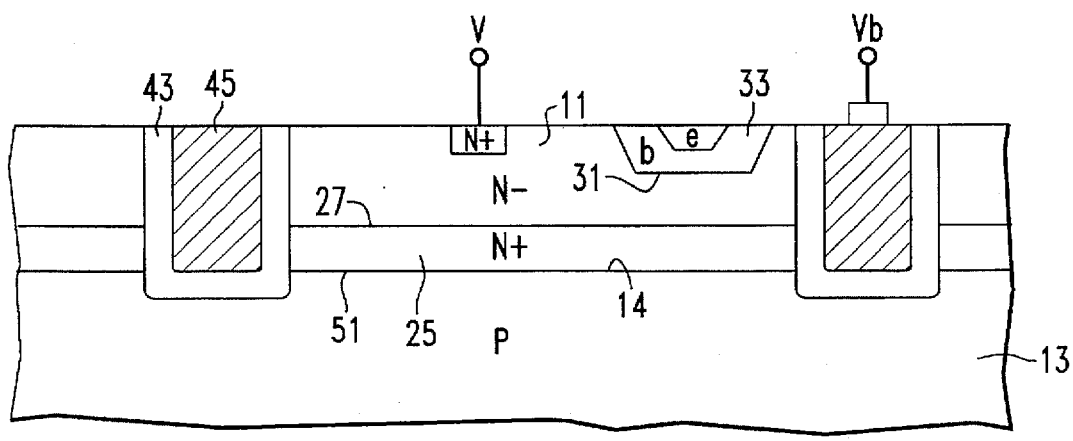

FIGS. 2 and 3 diagrammatically illustrate examples of trench-isolated island integrated circuit architectures having the above described buried high impurity concentration region forming an N+/N− interface or junction with the more lightly doped N-type material of the island. In the silicon-on-insulator structure shown in FIG. 2, the support substrate 13 underlies a dielectric (oxide) layer 41, which is continuous with the dielectric material 43 formed on the sidewalls of a trench 45 that surrounds the island 11. Trench 45 extends from the top surface 17 of the island down to the top surface 14 of substrate 13. In the structure shown in FIG. 3, the top surface 14 of a P-type support substrate 13 underlies and is contiguous with buried layer 25, so as to form a PN junction 51 with the bottom of the island (buried layer 25). As in the structure of FIG. 1, in both the (bottom) junction-isolated structure of FIG. 3 and the SOI structure of FIG. 2, trench fill material 45 is biased at a voltage that effectively prevents the avalanche-inducement of electron/hole pairs in the vicinity of interface As described above, in order to prevent hole/electron pairs from being generated at the N−/N+ island/buried layer interface 27, which would degrade the breakdown voltage characteristic of the device, the substrate or trench bias voltage Vb is set at a value which differs from the island voltage by a value no more that half the total voltage applied to the integrated circuit. More generally, when the integrated circuit has a maximum voltage Vmax and a minimum voltage Vmin, the voltage Vic across the integrated circuit is Vic=Vmax−Vmin and the polysilicon bias voltage Vpoly is defined by:

$$V_{min} + \tfrac{1}{4}Vic < V_{poly} < V_{max} - \tfrac{1}{4}Vic.$$

As mentioned previously, one way to meet this requirement is to simply tie the substrate to the island bias voltage. Thus, for example, in the case of a PNP telecommunications transistor circuit, which operates between +5 volts and (an island bias voltage of) −48 volts, the resulting voltage differential is 53 volts, so that the trench bias voltage Vt may be set at a value no more positive than −26.5 volts and preferably at the −48 volt bias applied to the P-island.

Where respective islands (whether they be formed in dielectrically isolated pockets or islands in the surface of a substrate, as in FIG. 1, or are trench-isolated architectures, as in FIGS. 2 and 3), do not share a common (continuously connected) substrate, the surrounding material of each island must be biased at a voltage sufficiently close to the island voltage as to prevent avalanche-generation of carrier pairs; this voltage may be the same bias voltage applied to the island material itself. Namely, when the polysilicon around one device is not connected to that around other critical devices, the polysilicon is preferably tied to the island terminal of the critical device which it surrounds. In general, with the voltage across the device being VD, with the island being assumed to be at zero volts, the voltage Vpoly on the surrounding polysilicon will be:

$$V_{poly} < 0.75 V_D \text{ if } V_D > 0$$

$$V_{poly} > 0.25 V_D \text{ if } V_D < 0.$$

Using the biasing technique of the present invention, it has been found that for a 600V breakdown device, the thickness of the island sidewall oxide may be in the range of 0.5–4.5 microns, with a typical value on the order of one to two microns. Thinner oxides can be used when the polysilicon around some islands are at a different voltage than is the polysilicon around other islands than can be used when all of the polysilicon is at the same voltage, since the maximum voltage between the island and the surrounding polysilicon can be made less in the first case.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor device comprising:

a semiconductor substrate containing a semiconductor island region of a first conductivity type having sidewalls which abut a first side of dielectric material that prescribes said island region, a second side of said dielectric material being contiguous with material capable of distributing a voltage applied thereto;

a first semiconductor region of said first conductivity type, and having an impurity concentration different from that of said island region, disposed in said island region, so as to define a relatively high-to-low impurity concentration junction between said first semiconductor region and said island region, said relatively high-to-low impurity concentration junction corresponding to a readily measurable transition of doping concentration within said island region, as opposed to a graded profile from high-to-low doping such as a Gaussian distribution from a top surface of said island region toward the bottom of said island region or a low-to-high retrograde profile measured from said top surface of said island region, said relatively high-to-low impurity concentration junction intersecting said dielectric material at a sidewall of said semiconductor island region;

a second semiconductor region of a second conductivity type disposed in said island region so as to define a PN junction between said second semiconductor region and said island region, said island region and said second semiconductor region being coupled to receive respective bias voltages which reverse bias said PN junction; and wherein said PN junction is spaced apart from said sidewalls of said semiconductor island region, and said material capable of distributing a voltage applied thereto is coupled to receive a prescribed bias voltage that is insufficient to cause the avalanche-generation of electron-hole pairs in the vicinity of said relatively high-to-low impurity concentration junction; and wherein said prescribed bias voltage differs from the island bias voltage by a value no more than half the total voltage applied to said semiconductor device.

2. A semiconductor device according to claim 1, wherein said prescribed bias voltage corresponds to the island bias voltage.

3. A semiconductor device comprising:

a semiconductor substrate containing a semiconductor island region of a first conductivity type having sidewalls which abut a first side of dielectric material that prescribes said island region, a second side of said dielectric material being contiguous with material capable of distributing a voltage applied thereto;

a first semiconductor region of said first conductivity type, and having an impurity concentration different from that of said island region, disposed in said island region, so as to define a relatively high-to-low impurity concentration junction between said first semiconductor region and said island region, said relatively high-to-low impurity concentration junction corresponding to a readily measurable transition of doping concentration within said island region, as opposed to a graded profile from high-to-low doping such as a Gaussian distribution from a top surface of said island region toward the bottom of said island region or a low-to-high retrograde profile measured from said top surface of said island region, said relatively high-to-low impurity concentration junction intersecting said dielectric material at a sidewall of said semiconductor island region;

a second semiconductor region of a second conductivity type disposed in said island region so as to define a PN junction between said second semiconductor region and said island region, said island region and said second semiconductor region being coupled to receive respective bias voltages which reverse bias said PN junction; and wherein said PN junction is spaced apart from said sidewalls of said semiconductor island region, and said material capable of distributing a voltage applied thereto is coupled to receive a prescribed bias voltage that is insufficient to cause the avalanche-generation of electron-hole pairs in the vicinity of said relatively high-to-low impurity concentration junction; and wherein each of said island region and said material capable of distributing a voltage applied thereto are coupled to receive the same bias voltage.

4. A semiconductor device comprising:

a semiconductor layer of a first conductivity type coupled to receive a first bias voltage and having a first semiconductor region of a second conductivity type disposed in a first portion thereof forming a PN junction with said semiconductor layer, said first semiconductor region being coupled to a second bias voltage which reverse biases said PN junction, said semiconductor layer further having a second semiconductor region of said first conductivity type disposed in a second portion thereof, spaced apart from said PN junction, and having an impurity concentration different from that of said semiconductor layer, so as to define a relatively high-to-low impurity concentration junction between said semiconductor layer and said second semiconductor region, said relatively high-to-low impurity concentration junction corresponding to a readily measurable transition of doping concentration within said semiconductor layer, as opposed to a graded profile from high-to-low doping such as a Gaussian distribution from a top surface of said semiconductor layer toward the bottom of said semiconductor layer or a low-to-high retrograde profile measured from said top surface of said semiconductor layer;

a trench surrounding said first portion of said semiconductor layer, and containing dielectric material along sidewalls of said trench, such that said relatively high-to-low impurity concentration junction intersects dielectric material in said trench; and wherein said PN junction is spaced apart from said trench, and said material capable of distributing a voltage applied thereto is coupled to receive a prescribed bias voltage that is insufficient to cause avalanche-generation of electron-hole pairs in the vicinity of said relatively high-to-low impurity concentration junction; and wherein said prescribed bias voltage differs from the island bias voltage by a value no more than half the total voltage applied to said semiconductor device.

5. A semiconductor device comprising:

a semiconductor layer of a first conductivity type coupled to receive a first bias voltage and having a first semiconductor region of a second conductivity type disposed in a first portion thereof forming a PN junction with said semiconductor layer, said first semiconductor region being coupled to a second bias voltage which reverse biases said PN junction, said semiconductor layer further having a second semiconductor region of said first conductivity type disposed in a second portion thereof, spaced apart from said PN junction, and having an impurity concentration different from that of said semiconductor layer, so as to define a relatively high-to-low impurity concentration junction between said semiconductor layer and said second semiconductor region, said relatively high-to-low impurity concentration junction corresponding to a readily measurable transition of doping concentration within said semiconductor layer, as opposed to a graded profile from high-to-low doping such as a Gaussian distribution from a top surface of said semiconductor layer toward the bottom of said semiconductor layer or a low-to-high retrograde profile measured from said top surface of said semiconductor layer;

a trench surrounding said first portion of said semiconductor layer, and containing dielectric material along sidewalls of said trench, such that said relatively high-to-low impurity concentration junction intersects dielectric material in said trench; and wherein said PN junction is spaced apart from said trench, and said material capable of distributing a voltage applied thereto is coupled to receive a prescribed bias voltage that is insufficient to cause avalanche-generation of electron-hole pairs in the vicinity of said relatively high-to-low impurity concentration junction; and wherein said prescribed bias voltage corresponds to the semiconductor layer bias voltage.

6. A semiconductor device comprising:

a semiconductor layer of a first conductivity type coupled to receive a first bias voltage and having a first semiconductor region of a second conductivity type disposed in a first portion thereof forming a PN junction with said semiconductor layer, said first semiconductor region being coupled to a second bias voltage which reverse biases said PN junction, said semiconductor layer further having a second semiconductor region of said first conductivity type disposed in a second portion thereof, spaced apart from said PN junction, and having an impurity concentration different from that of said semiconductor layer, so as to define a relatively high-to-low impurity concentration junction between said semiconductor layer and said second semiconductor region, said relatively high-to-low impurity concentration junction corresponding to a readily measurable transition of doping concentration within said semiconductor layer, as opposed to a graded profile from high-to-low doping such as a Gaussian distribution from a top surface of said semiconductor layer toward the bottom of said semiconductor layer or a low-to-high retrograde profile measured from said top surface of said semiconductor layer;

a trench surrounding said first portion of said semiconductor layer, and containing dielectric material along sidewalls of said trench, such that said relatively high-to-low impurity concentration junction intersects dielectric material in said trench; and wherein said PN junction is spaced apart from said trench, and said material capable of distributing a voltage applied thereto is coupled to receive a prescribed bias voltage that is insufficient to cause avalanche-generation of electron-hole pairs in the vicinity of said relatively high-to-low impurity concentration junction; and wherein each of said semiconductor layer and said material capable of distributing a voltage applied thereto are coupled to receive the same bias voltage.

7. A semiconductor device comprising:

a semiconductor substrate containing a semiconductor island region of a first conductivity type having sidewalls which abut a first side of dielectric material that prescribes said island region, a second side of said dielectric material being contiguous with material capable of distributing a voltage applied thereto;

a first semiconductor region of said first conductivity type, and having an impurity concentration different from that of said island region, disposed in said island region and defining a relatively high-to-low impurity concentration junction between said semiconductor region and said island region, said relatively high-to-low impurity concentration junction intersecting said dielectric material at a sidewall of said semiconductor island region, said relatively high-to-low impurity concentration junction corresponding to a readily measurable transition of doping concentration within said island region, as opposed to a graded profile from high-to-low doping such as a Gaussian distribution from a top surface of said island region toward the bottom of said island region or a low-to-high retrograde profile measured from said top surface of said island region;

a second semiconductor region of a second conductivity type disposed in said island region and defining a PN junction between said second semiconductor region and said island region, said island region and said second semiconductor region being coupled to receive respective bias voltages which reverse bias said PN junction; and wherein said PN junction is spaced apart from said sidewalls of said semiconductor island region, and said material capable of distributing a voltage applied thereto is coupled to receive a prescribed bias voltage, said prescribed bias voltage having a value such that, when said material capable of distributing a voltage applied thereto is biased at said prescribed bias voltage, said PN junction has a breakdown voltage which is greater than the breakdown voltage of said PN junction when said material capable of distributing a voltage applied thereto is biased at the same bias voltage applied to said second semiconductor region.

8. A semiconductor device according to claim 7, wherein said prescribed bias voltage differs from the island bias voltage by a value no more than half the total voltage applied to said semiconductor device.

9. A semiconductor device according to claim 8, wherein said prescribed bias voltage corresponds to the island bias voltage.

* * * * *